United States Patent [19]

Kawamura et al.

[11] Patent Number: 4,477,183

[45] Date of Patent: Oct. 16, 1984

[54] AUTOMATIC FOCUSING APPARATUS

[75] Inventors: Yoshio Kawamura, Koutou; Akihiro Takanashi, Kokubunji; Toshiei Kurosaki, Edogawa; Shinji Kuniyoshi, Suginami; Sumio Hosaka, Nishitama; Tsuneo Terasawa, Kokubunji, all of Japan

[73] Assignee: Hitachi, Ltd., Tokyo, Japan

[21] Appl. No.: 445,079

[22] Filed: Nov. 29, 1982

[30] Foreign Application Priority Data

Dec. 7, 1981 [JP] Japan .......................... 56-181162[U]

[51] Int. Cl.³ .............................................. G03B 27/52
[52] U.S. Cl. ...................................... 355/55; 355/53; 355/54; 355/56
[58] Field of Search ..................................... 355/53–56; 354/25 A, 25 P, 25 N; 330/9; 318/632

[56] References Cited

U.S. PATENT DOCUMENTS 3,917,930 11/1975 Davey et al. .................. 318/632 X
3,984,678 10/1976 Uchiyama et al. ............. 355/56 X
4,032,856 6/1977 Goldner ........................... 330/9 X
4,298,273 11/1981 Nishizuka et al. ............. 355/53 X

FOREIGN PATENT DOCUMENTS 52-119927 10/1977 Japan .
56-12201 2/1981 Japan .

Primary Examiner—L. T. Hix
Assistant Examiner—Della J. Rutledge
Attorney, Agent, or Firm—Antonelli, Terry & Wands

[57] ABSTRACT

An automatic focusing apparatus according to the present invention is constructed of a base on which a substrate is placed, detection means for detecting a pressure of air which is caused to flow out of an interspace between the substrate and an orifice by spurting the air from the orifice toward the substrate, reference pressure generation means for generating a reference pressure which is necessary for setting a standard distance between the substrate and the orifice, a pressure transducer which receives pressure signals from said detection means and said reference pressure generation means and which converts a pressure difference between these pressure signals into an electric signal, base drive means for moving the substrate in parallel with the orifice on the basis of the output signal from said pressure transducer, and offset signal generation means for generating a signal which, when superposed on the output signal from said pressure transducer, serves to shift the substrate from the standard distance.

7 Claims, 2 Drawing Figures

AUTOMATIC FOCUSING APPARATUS

BACKGROUND OF THE INVENTION

The present invention relates to improvements in an automatic focusing apparatus which is intended to hold constant the distances of the focusing etc. of a projection aligner for use in the production of semiconductor devices.

As a projection aligner for producing a semiconductor device of fine pattern dimensions, there is a 1/10 reduction projection aligner in which a magnified pattern of 10 times is reduced and projected on a substrate through a reduction lens of high resolution while step-and-repeat operations are being performed.

The focusing depth of the reduction lens of high resolution is as very small as $\pm 1$ to 2 $\mu$m. In addition, in order to hold an image distortion within about 0.1 $\mu$m/10 mm-square, the surface of the substrate under the projection needs to be always held at a precision of $\pm 0.5$ $\mu$m or so with respect to the focal position of the reduction lens.

As apparatuses for focusing reduction lenses, there are ones disclosed in Japanese Laid-open Patent Application No. 52-119927 and Japanese Laid-open Utility Model Registration Application No. 56-12201.

FIG. 1 shows the arrangement of such prior-art focusing apparatus. Clean air under a constant pressure is sent from a pressure regulator 409 to a detector 402, disposed at the lower end of a lens housing 401, and to a reference detector 406 by pipes 404 and 408 respectively, and it is spurted from the orifices of the detectors. Pressure signals from the detector 402 and the reference detector 406, corresponding to the respective distances of the orifices to a substrate 412 and a reference plate 418, are sent to a pressure transducer 421 by pipes 403 and 407 respectively. An electric signal 422 from the pressure transducer 421 is applied via an amplifier 423 to a servomotor 424, which drives a base 413 so that the electric signal may become null. Thus, the clearance between the substrate 412 and the detector 402 is held at a predetermined optimum focal length at all times. In setting the optimum focal position, the fact is exploited that when the clearance between the reference detector 406 and the reference plate 418 is varied by means of a screw 417, the clearance between the detector 402 and the substrate 412 changes accordingly.

Here, the base 413 is mounted on a rigid base 419 through a transfer means 414.

On the other hand, in case of actually using the projection aligner, it is often required to vary a focal position on a substrate stepwise over a certain range above and below an optimum focal position and then move the substrate finely, thereby to project a pattern on the substrate in an offset position. In the above example of the prior art, this requirement is dealt with by varying the clearance between the reference detector 406 and the reference plate 418. This measure, however, has the following four disadvantages: (1) Since a great distance between the reference detector 406 and the detector 402 degrades servo characteristics, the reference detector 406 cannot be disposed far, and hence, the remote control is difficult. (2) The reference detector 406 for setting the optimum focal position to serve as a standard is made variable, so that the standard set position is liable to move. (3) The reference detector 406 is made movable, so that the centralized remote control employing a computer is difficult. (4) With the prior-art arrangement, that positioning accuracy of the substrate 412 which is attained by shifting the position is $\pm 0.5$ $\mu$m or so.

SUMMARY OF THE INVENTION

Accordingly, the present invention has for its object to provide an automatic focusing apparatus according to which the position of a substrate relative to the focal position of an optical system can be varied and set in the direction of an optical axis at high precision and with ease.

The present invention for accomplishing the object is characterized in that an automatic focusing apparatus is constructed of a base on which a substrate is placed, detection means for detecting a pressure of air which is caused to flow out of an interspace between the substrate and an orifice by spurting the air from the orifice toward the substrate, reference pressure generation means for generating a reference pressure which is necessary for setting a standard distance between the substrate and the orifice, a pressure transducer which receives pressure signals from said detection means and said reference pressure generation means and which converts a pressure difference between these pressure signals into an electric signal, base drive means for moving the substrate in parallel with the orifice on the basis of the output signal from said pressure transducer, and offset signal generation means for generating a signal which, when superposed on the output signal from said pressure transducer, serves to shift the substrate from the standard distance.

Owing to such characterizing construction of the present invention, even in case of shifting a substrate from a standard focal position and then finely moving and positioning the substrate, it has become possible to finely move and position the substrate with ease and at high precision by the remote control while the standard focal position is held intact at high precision.

BRIEF DESCRIPTION OF THE DRAWINGS

FIG. 1 is a schematic diagram of a prior-art automatic focusing apparatus, while

DETAILED DESCRIPTION

Figure 2:
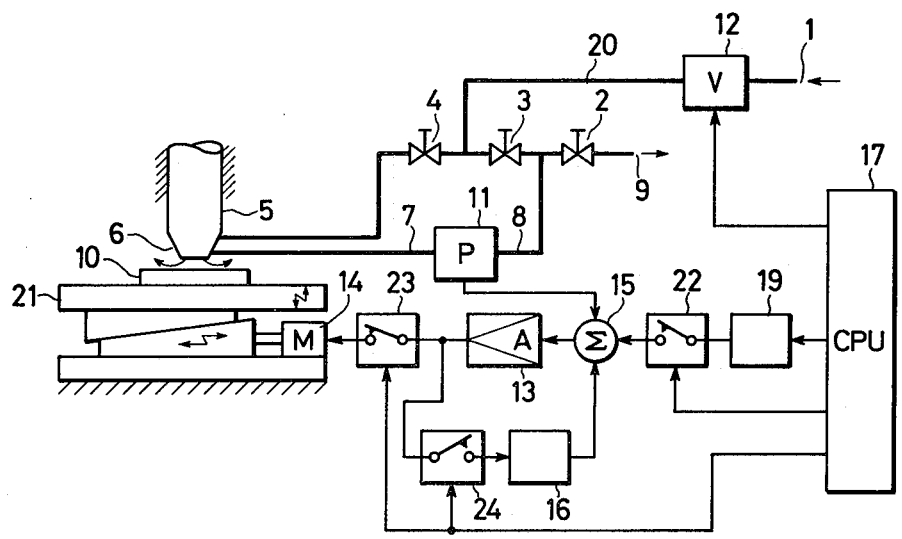
FIG. 2 is a schematic diagram of an embodiment of an automatic focusing apparatus according to the present invention.

FIG. 2 shows the fundamental arrangement of an automatic focusing apparatus according to the present invention. Referring to the figure, cleaned air is sent to a pressure regulator 12 in the direction of an arrow 1.

Figure 1:
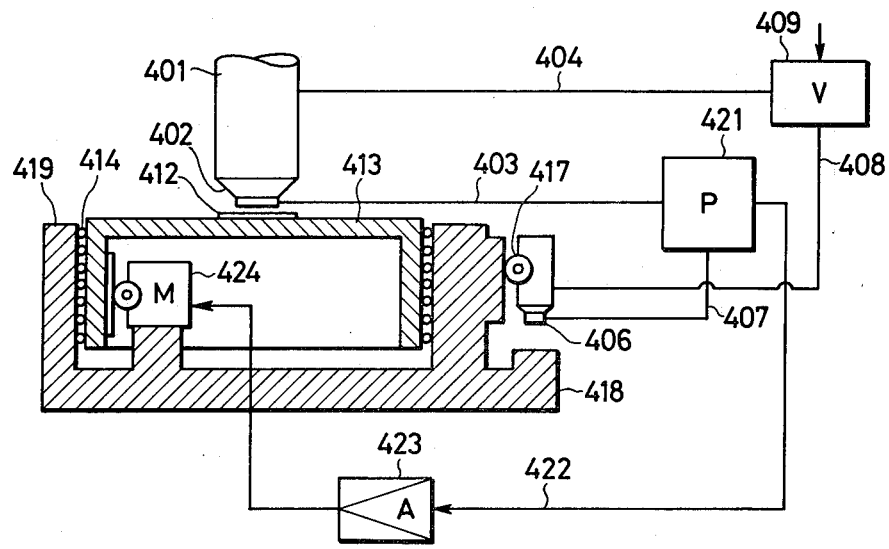

The air under a constant pressure emerging from the pressure regulator 12 is led to a detector 5, disposed at the lower end of a lens housing (not shown), via a needle valve 4 by a pipe 20, and it is emitted from an orifice 6 of the detector into the atmospheric air through the clearance between the orifice and a substrate 10. On the other hand, part of the air sent by the pipe 20 advances via a needle valve 3 as well as a needle valve 2 and is emitted into the atmospheric air as indicated by an arrow 9. The above combination of the needle valves 3 and 2 plays the same role as that of the reference detector 406 and the reference plate 418 shown in FIG. 1. The needle valve 4 and the orifice 6 play the same role as that of a needle valve built in the detector 402 of FIG. 1.

A detected output corresponding to the clearance between the substrate 10 and the detector 5 in FIG. 2 is led to a pressure transducer 11 by a pipe 7, while a reference pressure between the needle valves 3 and 2 is led thereto by a pipe 8. The pressure transducer 11 converts the pressure difference between the detected pressure and the reference pressure into an electrical analog signal, which is applied via an amplifier 13 to a driving motor 14 for raising and lowering a base 21, as an electric output.

A zero adjusting circuit 16 in FIG. 2 is one which is disclosed in Japanese Laid-open Utility Model Registration Application No. 56-12201 referred to before. It is a circuit for setting and adjusting a zero point so that, when the pressure difference between the detected pressure and the reference pressure applied to the pressure transducer 11 has become zero, the output of the amplifier 13 may become null so as for the motor 14 to keep its stopped state. That is, it is a zero adjusting D.C. voltage generator circuit having the function of detecting the output voltage of the amplifier 13 in the aforementioned state of the null differential pressure and generating a D.C. voltage so as to adjust the detected voltage. In other words, it is an adjusting circuit for eliminating an offset value in a control circuit which is constructed of the pressure transducer 11, an adder circuit 15, the amplifier 13, and a circuit, not shown, for amplifying an analog signal from a tachometer for feeding back the speed of the motor 14.

The feature of the present invention consists in that a switching circuit 22 and a voltage generator circuit 19, which makes it possible to apply a predetermined voltage, are further disposed besides the control circuit mentioned above. The voltage generator circuit 19 is a fine movement driving servo circuit which has the function of generating a D.C. voltage through the digital-to-analog conversion of a digital value from a CPU (central processing unit) 17. This voltage generator circuit 19 permits a manual control in addition to the control by the CPU 17.

The pressure regulator 12 has a solenoid valve which allows or inhibits the flow of the air. It is controlled by the CPU 17, together with the respective circuits mentioned above.

Under the state which both the detected pressure and the reference pressure applied to the pressure transducer 11 are equalized to the atmospheric pressure by closing the pressure regulator 12, turning "off" a switching circuit 23 and turning "on" a switching circuit 24, the zero adjusting circuit 16 is set so that the output from the amplifier 13 may become null. After the zero point has been set by the zero adjusting circuit 16, the switching circuit 24 is turned "off".

Subsequently, when the air is sent by opening the pressure regulator 12 and turning "on" the switching circuit 23, the motor 14 is driven so that the differential pressure between the detected pressure and the reference pressure may become null at a preset standard optimum focal position. The switching circuits 22, 23 and 24 are ON/OFF-controlled by control signals from the CPU 17. In addition, manual controls are possible. With the prior-art apparatus, the control ends with the above positioning operation, and in order to give the base 21 any desired offset from the standard position, any of the needle valves 2, 3 and 4 is opened or closed as is necessary.

In contrast, according to the present invention, the needle valves 2, 3 and 4 are not touched at all after the standard position has been set, and electrically an offset voltage is applied to the driving motor 14 via the adder circuit 15 by means of the switching circuit 22 as well as the voltage generator circuit 19 for producing the predetermined voltage. The base 21 having had the offset voltage applied thereto by the voltage generator circuit 19 moves up or down by a predetermined level, so that a pressure difference develops between the detected pressure and the reference pressure. Then, the base 21 is eventually held at a position where a voltage value obtained by converting the pressure difference by means of the pressure transducer 11 has balanced to the aforementioned offset voltage.

In order to keep the response characteristics of a system good in practical use, the needle valves 2, 3 and 4 need to be installed near the detector 5 or the lens housing of the projection aligner. In this regard, the present invention has made it unnecessary to operate the valves near the housing of the projection aligner and has made it possible to finely move the base 21 in the offset manner by the electrical remote control. Moreover, once the optimum focal position serving as a standard has been set by the use of the needle valves 2, 3 and 4, these valves are not touched and moved again, and the standard focal position is always reproduced by merely turning "off" the switching circuit 22. This brings forth the advantage of enhancing the precision at which the standard position is held. Since the variable operations of the needle valves 2, 3 and 4 are unnecessary, all the circuit operations can be effected by the centralized control employing the CPU 17. It has therefore become possible to construct systems suited to semiconductor production apparatuses which detest dust.

Moreover, since the purpose is achieved without resorting to the adjustments of the needle valves 2, 3 and 4, the offset fine movement of the substrate 10 is readily given. In addition, the positioning accuracy of the offset fine movement has been enhanced. In case of the present embodiment, the positioning accuracy of the offset fine movement is as high as within 350.2 μm.

As set forth above, according to the present invention, it has become possible to provide an automatic focusing apparatus in which, in case of shifting a substrate surface in a projection aligner from a standard focal position and finely moving and positioning it, the substrate surface can be finely moved and positioned with ease and at high precision by the remote control while the standard focal position is held intact at high precision.

We claim:

1. An automatic focusing apparatus comprising a base on which a substrate is placed, detection means for detecting a pressure of air which is caused to flow out of an interspace between the substrate and an orifice by spurting the air from the orifice toward the substrate, reference pressure generation means for generating a reference pressure which is necessary for setting a standard distance between the substrate and the orifice, a pressure transducer which receives pressure signals from said detection means and said reference pressure generation means and which converts a pressure difference between these pressure signals into an electric signal, base drive means for moving the substrate in parallel with the orifice on the basis of the output signal from said pressure transducer, and offset signal generation means for generating an offset electrical signal which, when superposed on the output electrical signal from said pressure transducer, serves to shift the substrate from the standard distance.

2. An automatic focusing apparatus according to claim 1, wherein said base drive means includes an amplifier which amplifies the output signal from said pressure transducer, an adjusting circuit which is connected between input and output terminals of said amplifier in order to compensate a drift of said amplifier, and an adder circuit which is connected on the input side of said amplifier in order to add outputs of said pressure transducer, said adjusting circuit and said offset signal generation means.

3. An automatic focusing apparatus according to claim 2, wherein said offset signal generation means is connected to said adder circuit through a switch.

4. An automatic focusing apparatus according to claim 1, wherein said reference pressure generation means includes first and second needle valves which are incorporated midway of a first pipe for causing the air to flow therethrough, and a second pipe which is branched from a part of said first pipe between said first and second needle valves.

5. An automatic focusing apparatus according to claim 1, further comprising means providing a path for the flow of air of said detection means, and adjusting means for adjusting the air flow in the air flow path to said detection means to set the standard distance between the substrate and the orifice, said offset signal generation means generating the electrical signal for enabling the shifting of the substrate from the standard distance to an offset distance without operation of said adjustment means so that the substrate is maintainable at the offset distance.

6. An automatic focusing apparatus according to claim 1, wherein said offset signal generation means includes a central processing unit for generating a digital offset signal, digital-to-analog conversion means responsive to the digital offset signal for generating an analog offset signal, and means for superposing the analog offset signal on the output signal from said pressure transducer for shifting the substrate to the offset distance.

7. An automatic focusing apparatus according to claim 1, wherein the offset electrical signal produced by said offset signal generation means is representative of an offset distance from the standard distance, and further comprising means for superposing the offset electrical signal and the output electrical signal of said pressure transducer, said base drive means being responsive to the superposed signal for shifting and maintaining the substrate at the offset distance from the standard distance.

* * * * *